United States Patent [19]

Fukatsu et al.

[11] Patent Number: 5,986,302

[45] Date of Patent: Nov. 16, 1999

[54] SEMICONDUCTOR MEMORY DEVICE

[75] Inventors: Shigemitsu Fukatsu, Okazaki; Tsutomu Kawaguchi, Nagoya; Takuya Okuno; Yukiaki Yogo, both of Nukata-gun, all of Japan

[73] Assignee: Denso Corporation, Kariya, Japan

[21] Appl. No.: 09/018,305

[22] Filed: Feb. 3, 1998

[30] Foreign Application Priority Data

Feb. 4, 1997 [JP] Japan .................................. 9-021735

[51] Int. Cl.$^6$ .......................... H01L 29/76; H01L 29/788; H01L 29/792

[52] U.S. Cl. .......................... 257/315; 257/316; 257/324

[58] Field of Search .................. 257/314–324, 257/214–326; 438/257–264

[56] References Cited

U.S. PATENT DOCUMENTS

| 5,051,794 | 9/1991 | Mori | 257/324 |
|---|---|---|---|
| 5,208,175 | 5/1993 | Choi et al. | |
| 5,306,655 | 4/1994 | Kurimoto | |
| 5,434,813 | 7/1995 | Tamura et al. | 257/316 |
| 5,684,317 | 11/1997 | Hwang | 257/324 |

FOREIGN PATENT DOCUMENTS

| 1-120870 | 5/1989 | Japan . |
| 5-299662 | 11/1993 | Japan . |
| 6-237004 | 8/1994 | Japan . |
| 8-148585 | 6/1996 | Japan . |

*Primary Examiner*—Minh Loan Tran
*Assistant Examiner*—Cuong Q Nguyen
*Attorney, Agent, or Firm*—Pillsbury Madison & Sutro LLP

[57] ABSTRACT

A floating gate of a semiconductor memory device has a gate bird beak on an end portion thereof. Further, a positional relationship between the floating gate and a drain is controlled such that a depletion layer formed within the drain in a non-selected state of the semiconductor memory device faces the gate bird beak without interposing the drain therebetween. Accordingly, drain disturbance can be efficiently prevented.

37 Claims, 6 Drawing Sheets

— DRAIN SIDE DEPLETION LAYER
---- SUBSTRATE SIDE DEPLETION LAYER
—·— PN JUNCTION

SEMICONDUCTOR MEMORY DEVICE

CROSS REFERENCE TO RELATED APPLICATION

This application is based upon and claims the benefit of priority of the prior Japanese Patent Application No. 9-21735 filed on Feb. 4, 1997, the contents of which are incorporated herein by reference.

BACKGROUND OF THE INVENTION

1. Field of the Invention

The present invention relates to a MIS (Metal Insulator Semiconductor) transistor type semiconductor memory device having a two-layer gate electrode made up of a floating gate and a control gate. In particular, the invention can be preferably applied to EPROMs, EEPROMs, flash EEPROMS, and the like.

2. Related Arts

A flash memory is widely known as a nonvolatile semiconductor memory capable of electrically writing and erasing information therein. Such a flash memory generally includes a floating gate provided on a substrate through a first gate insulating layer (a tunnel layer) and a control gate provided on the floating gate through a second gate insulating layer. Further, source and drain are provided in a surface region of the substrate to face both ends of the control gate.

Next, typical operations, i.e., (a) a reading operation, (b) a writing operation, and (c) an erasing operation, of the cell of the flash memory will be explained with reference to FIGS. 1A, 1B, and 1C. When the reading operation is carried out, a positive voltage in a range of 1 to 2 V is applied to the drain, the source is grounded, and a voltage Vcc is applied to the control gate as shown in FIG. 1A. In this state, readout of the information is performed by detecting if a channel current flows. When the writing operation is carried out, the voltage Vcc is applied to the drain, the source is grounded, and a positive high voltage Vpp of, for example, +12 V is applied to the control gate as shown in FIG. 1B. Accordingly, hot electrons are injected into the floating gate from between a channel and the drain through the tunnel layer by a tunnel effect. Further, when erasing operation is carried out, the voltage vcc is applied to the source, the drain is opened, and a negative high voltage Vpp is applied to the control gate as shown in FIG. 1C. Accordingly, the electrons stored in the floating gate are extracted and injected into the source by the tunnel effect.

In general, as shown in FIG. 2, a flash memory 100 includes a large number of bits arrayed in a matrix. When the above-mentioned writing and erasing operations are performed on the flash memory 100, a voltage is applied not only to terminals of bits that are selected (herebelow referred to as selected bits) but to terminals of the other bits (herebelow referred to as non-selected bits). As a result, the non-selected bits charges sometimes move between charge holding parts of the bits and the terminals to which the voltage is applied so that memories stored in the non-selected bits are erased.

This phenomenon is called disturbance in a nonvolatile memory. A particular type of this disturbance is drain disturbance, which arises when a voltage is applied to a drain of a non-selected bit under the writing operation. This drain disturbance phenomenon is further explained with reference to FIG. 3 showing the non-selected bit under the writing operation. Specifically, the source is grounded and the voltage $V_{cc}$ acts on the drain. Further, the control gate is on a ground level because it is not selected. In this state, by unintentionally applying an extra voltage to the terminal of the drain, a drain side end portion of the gate oxide layer underlying the floating gate is subject to an electrical field having a high field intensity. Consequently, there arises a possibility that the electrons are extracted from the floating gate through the gate oxide layer. This is the drain disturbance phenomenon. It is considered that because a drain side edge of the floating gate is angular, an electric field is likely to be concentrated on the angular edge of the floating gate and the drain disturbance sometimes results.

To avoid this, JP-A-5-29962, JP-A-6-237004, and the like disclose a method for preventing the drain disturbance by chamfering the drain side edge of the floating gate to mitigate the concentration of the electric field on the edge. However, as a result of experiments performed by the inventors, it was found that the drain disturbance could not be sufficiently prevented only by chamfering the drain side edge of the floating gate.

SUMMARY OF THE INVENTION

The present invention has been made in view of the above-mentioned problems. An object of the present invention is to provide a semiconductor memory device without generating drain disturbance phenomenon therein.

In a semiconductor memory device according to the present invention, a drain is formed in a substrate to have an overlapped portion overlapped with a floating gate through a first insulating layer. Further, a field intensity applied to the first insulating layer between the drain and the floating gate is controlled not to exceed 7 MV/cm in a non-selected state of the semiconductor memory device. Accordingly, drain disturbance can be efficiently prevented.

Specifically, the first insulating layer has a first region and a second region having a thickness thicker than that of the first region. In the non-selected state of the semiconductor memory device, a depletion layer extends inside of the drain such that the drain other than the depletion layer contacts only the second region of the first insulating layer.

To prevent the drain other than the depletion layer from contacting the first region of the first insulating layer in the non-selected state, a length of the second region of the first insulating layer may be controlled by controlling an oxidized amount of the floating gate for forming the second region. Further, an overlapped amount of the overlapped portion of the drain may be controlled by controlling a position of a junction between the drain and the substrate. The position of the junction can be controlled by controlling a diffusion distance of the drain in a direction parallel to a surface of the substrate, implantation distances of ions implanted into the substrate when the drain is formed, and the like.

BRIEF DESCRIPTION OF THE DRAWINGS

These and other objects and features of the present invention will become more readily apparent from a better understanding of a preferred embodiment described below with reference to the following drawings.

DETAILED DESCRIPTION OF THE PREFERRED EMBODIMENT

Figure 1A:
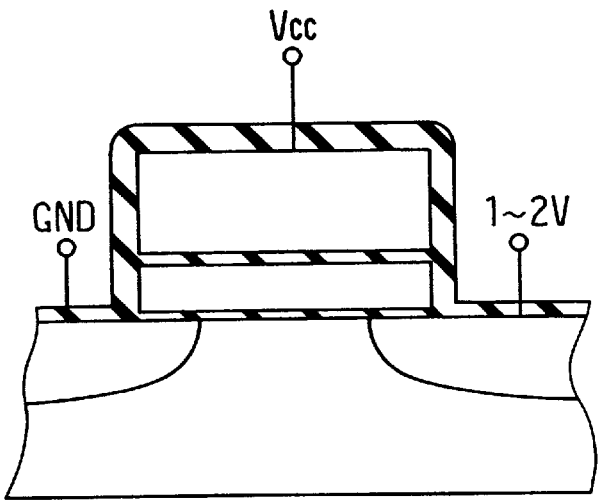
FIGS. 1A to 1C are schematic cross-sectional views for explaining operations of a flash memory.
Figure 1B:
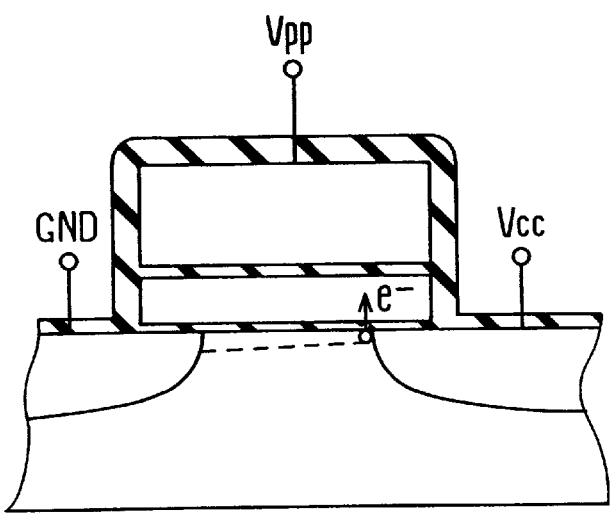
Figure 1C:
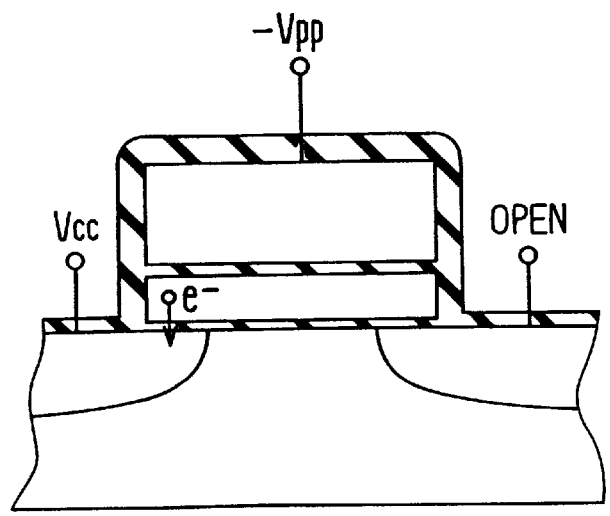
Figure 2:
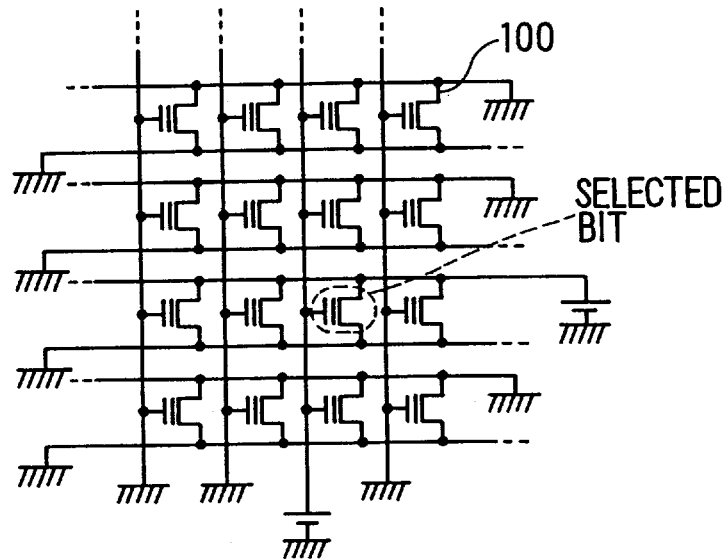
FIG. 2 is a schematic diaphragm showing an arrangement of a plurality of two-layer gate type semiconductor memory devices.
Figure 3:
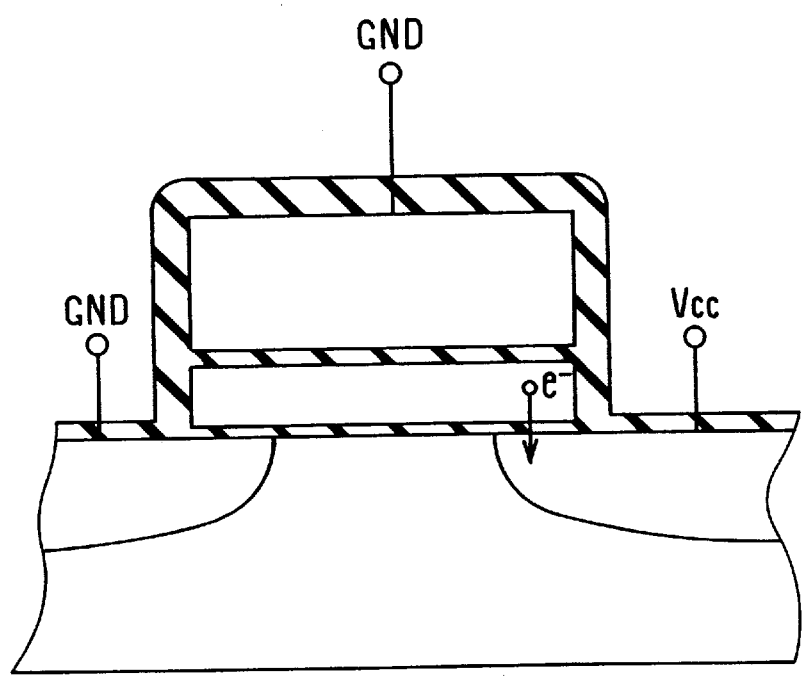
FIG. 3 is a schematic cross-sectional view for explaining drain disturbance phenomenon.
Figure 4A:
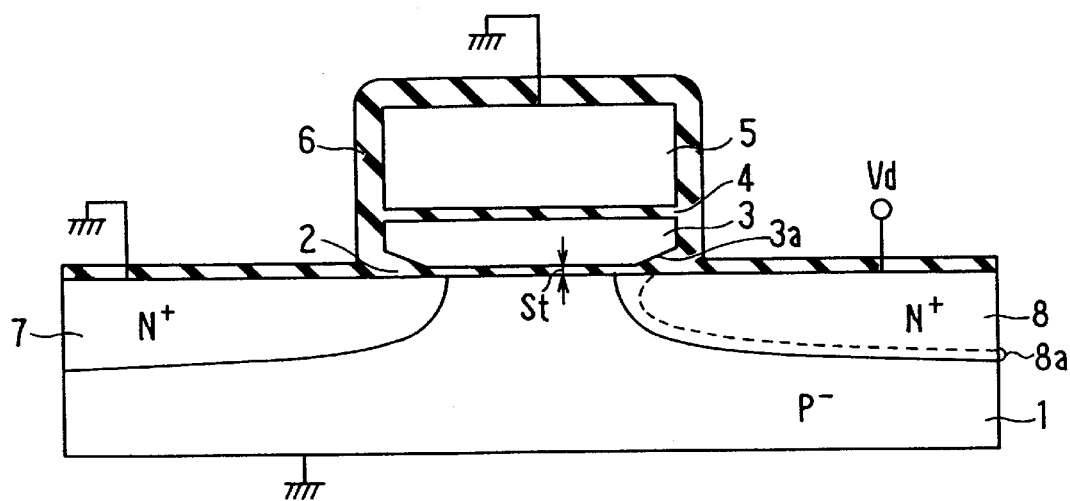
FIG. 4A is a cross-sectional view showing a two-layer gate type semiconductor memory device in a non-selected state in a preferred embodiment according to the present invention.
Figure 4B:
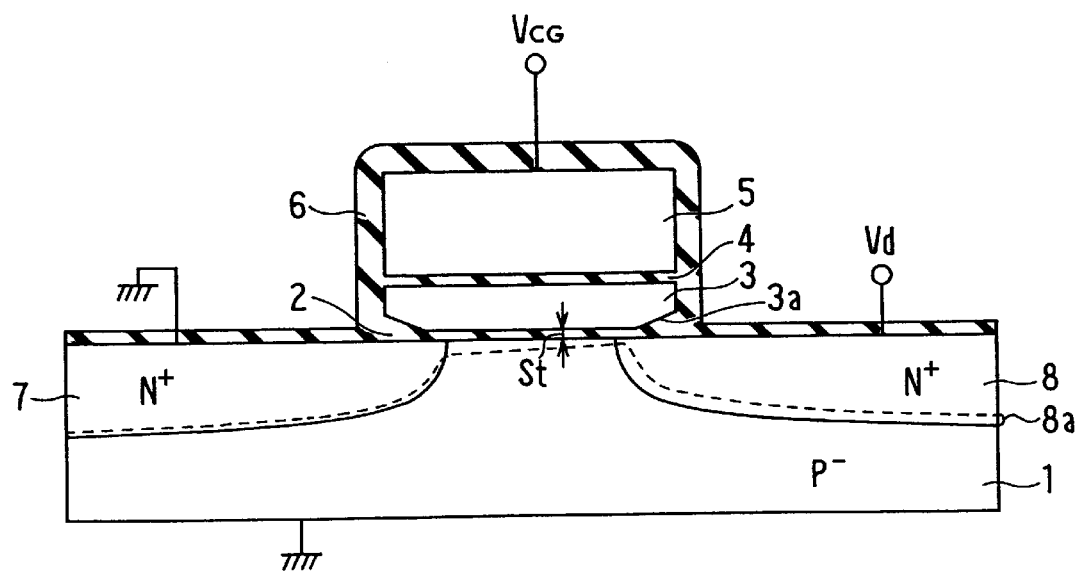
FIG. 4B is a cross-sectional view showing the two-layer gate type semiconductor memory device in a selected state in the embodiment.

In a preferred embodiment, the present invention is applied to a flash memory of a two-layer gate type MOS transistor shown in FIGS. 4A and 4B. First, a cell structure of the two-layer gate type MOS transistor will be explained.

A floating gate 3 as a first gate electrode is provided on a P-type silicon substrate 1 through a tunnel layer 2 serving as a first gate insulating layer. Further, a control gate 5 as a second gate electrode is provided on the floating gate 3 through a second gate insulating layer 4. The floating gate 3, the control gate 5 and the surface of the P-type silicon substrate 1 is covered with a side wall insulating layer 6.

Source and drain 7 and 8 are formed in a surface region of the silicon substrate 1 to respectively face ends of the floating gate 3. If necessary, each of the source and drain 7 and 8 may have an electric-field moderating layer on a channel region side thereof. The ends of the floating gate 3 are rounded off to form gate bird beaks 3a. More specifically, as shown in FIG. 4A, one of the gate bird beaks 3a on the drain side is formed to overlap with an end of a depletion layer extended inside of the drain 8 when a specific drain voltage vd for writing is applied to the drain 8 despite being in a non-selected state.

On the other hand, when the memory cell is selected to be written, as shown in FIG. 4B, regions in which free electrons exist (a region except for the depletion layer) in the source 7 and the drain 8 communicate with a channel region defined between the source 7 and the drain 8 so as not to deteriorate a wiring speed. That is, in the selected state, the bottom face of the gate bird beak 3 does not overlap with the depletion layer extending inside of the drain 8 (drain depletion layer) so that the region holding the free electrons in the drain 8 satisfactory overlaps with the tunnel layer 2 having a thickness of St (tunnel thickness). In this embodiment, an end of the junction of the drain 8 on a channel region side faces the tunnel layer 2 having the tunnel thickness of St. In this structure, it is important that the oxide layer 2 around a portion where hot electrons are produced during the writing operation has a tunnel thickness of St.

The above-mentioned structure of the present invention is based on analyses concerning an occurrence mechanism of drain disturbance. The analyses will be explained in detail below.

Figure 5:
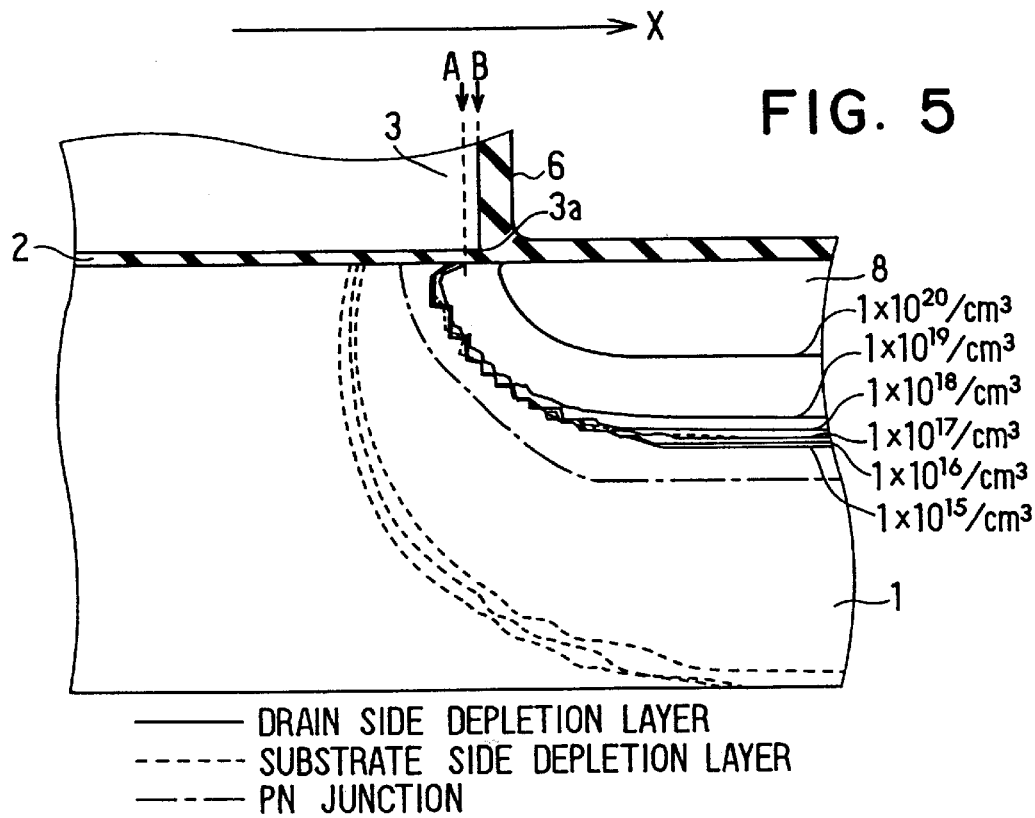
FIG. 5 is a simulation analysis chart showing a depletion layer around a drain in the two-layer gate type semiconductor memory device in the non-selected state.

When a writing operation is carried out on the selected bits, a specific voltage vd may be unintentionally applied to a drain 8 of a non-selected bit storing electrons therein and connected to the selected bits through the same bit line. Concerning such a case, a simulation analysis of a depletion layer spread around a PN junction between the drain 8 and the silicon substrate 1 in the non-selected bit was performed, and the result is shown in FIG. 5. The simulation analysis was, as shown in FIG. 5, carried out with respect to the non-selected bit in which the drain side edge of the floating gate 3 was not rounded off. The spreading state of the depletion layer is indicated by distribution of a carrier density (electron density). An end of the depletion layer within the drain 8 corresponds to a line representing a level of the carrier density of approximately $1 \times 10^{15}/cm^2$.

As shown in FIG. 5, the depletion layer is spread on both sides of the drain 8 and the substrate 1 around the PN junction between the drain 8 and the substrate 1. The depletion layer spreading inside of the drain 8 extends approximately along the shape of the PN junction. However, it is known that the depletion layer within the drain 8 further spreads toward the inside of the drain 8 at a portion close to the floating gate 3, i.e., close to the surface of the substrate 1. This is because the electrons held in the floating gate 3 and the electrons held in the drain 8 (N-type region) around the depletion layer repel to each other.

Figure 6:
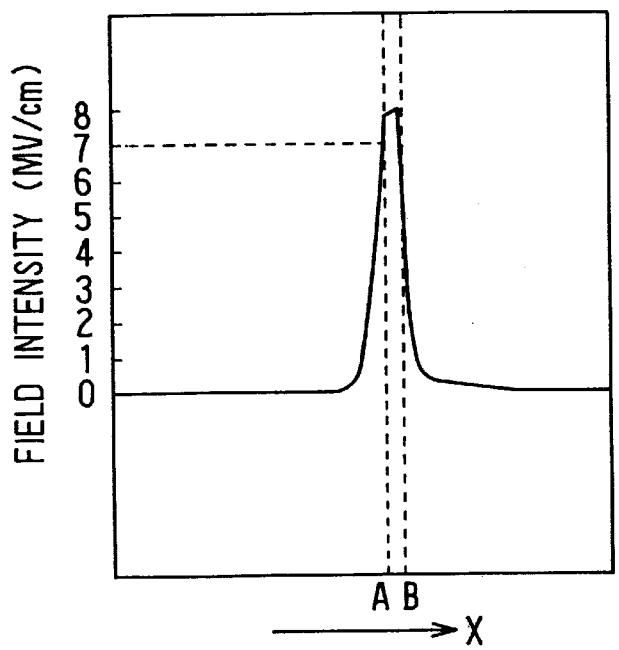
FIG. 6 is a graph showing distribution of a field intensity at a tunnel layer when a specific voltage acts on the drain of the semiconductor device shown in FIG. 5 in the non-selected state.

FIG. 6 shows distribution of a field intensity between the silicon substrate 1 and the floating gate 3 of the non-selected bit shown in FIG. 5. The x-axis of FIG. 6 indicates surface positions of the substrate 1. A direction of an arrow x and points A and B on the x-axis in FIG. 6 respectively correspond to a direction of an arrow X and points A and B in FIG. 5. As understood from FIG. 6, the field intensity becomes the maximum not on the drain side edge of the floating gate 3 but on a position a little shifted from the drain side edge of the floating gate 3. More specifically, the field intensity becomes the maximum between the points A and B, i.e., between an end of the drain depletion layer on the drain surface (herebelow referred to as a depletion layer end portion) and the drain side edge of the floating gate 3. That is, the field intensity becomes the maximum where the drain 8 holding the free electrons therein except the drain depletion layer faces the tunnel layer 2 having the tunnel thickness of St.

Provided that the floating gate 3 and the drain 8 were arranged with a specific relationship based on the above-mentioned analyses, drain disturbance in the non-selected bit could be prevented without rounding off the drain side edge of the floating gate 3. Further, if the drain side edge of the floating gate 3 was rounded off and the above-mentioned specific relationship between the floating gate 3 and the drain 8 was employed, the effect of preventing the drain disturbance would be further enhanced.

Further, according to another analysis of the inventors, it was founded that leakage between the drain 8 and the floating gate 3 became prominent when the maximum field intensity exceeded 7 MV/cm, causing the drain disturbance. In the non-selected bit shown in FIG. 5, the maximum field intensity exceeds 7 MV/cm as shown in FIG. 6. This means that the drain disturbance occurs in the non-selected bit shown in FIG. 5.

Figure 7A:
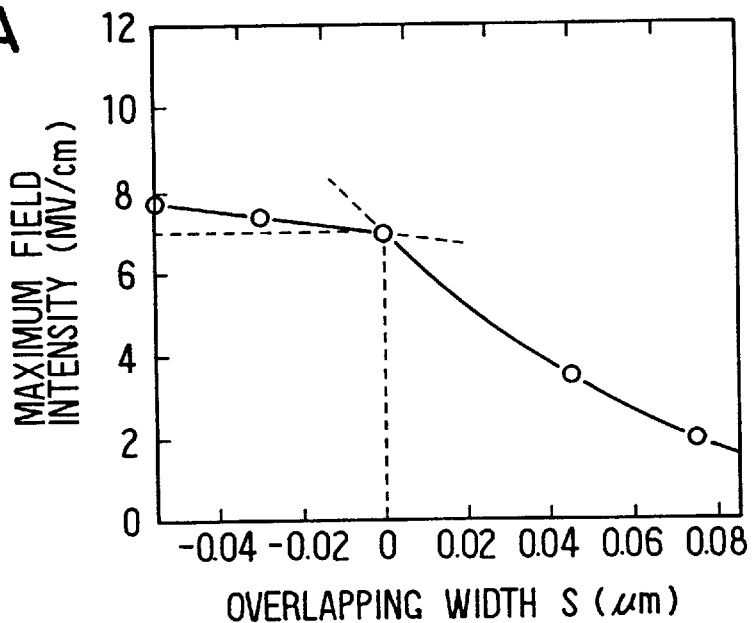
FIG. 7A is a graph showing a maximum field intensity between a floating gate and the drain with respect to overlapping widths between a drain depletion layer and a gate bird beak.
Figure 7B:
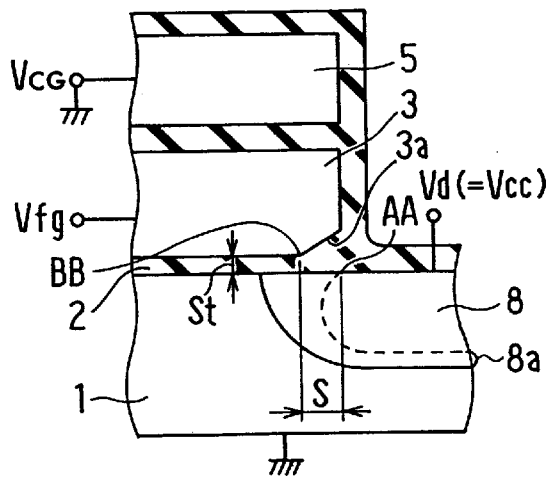
FIG. 7B is a schematic view showing an overlapping state of the gate bird beak and the drain depletion layer.
Figure 7C:
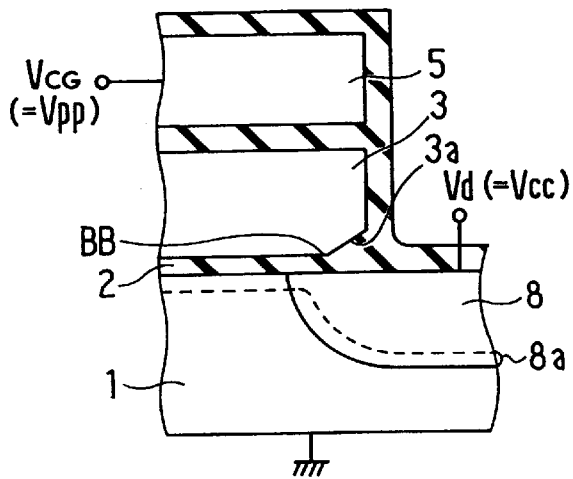
FIG. 7C is a schematic view showing a non-overlapping state of the gate bird beak and the drain depletion layer.

Next, in a case where the drain side edge of the floating gate 3 was rounded off, the depletion layer end portion was changed with respect to the portion of the tunnel layer 2 (the gate bird beak 3a), a thickness of which increases by rounding off the edge of the floating gate 3. Then, the maximum field intensities with respect to the depletion layer end portion were obtained. The results are shown in FIG. 7A. The x-axis of FIG. 7A indicates an overlapping width S shown in FIG. 7B between the depletion layer end portion AA and the portion BB, from which the tunnel layer 2 starts to extend, corresponding to the end portion of the gate bird beak 3a. When the depletion layer end portion AA is on a source side with respect to the portion BB of the tunnel layer 2 as shown in FIG. 7C, the width S is negative, and when the depletion layer end portion AA is on an opposite side of the source 7 with respect to the portion BB as shown in FIG. 7B, the width S is positive.

That is, when the bottom face of the floating gate 3 where the gate bird beak 3a is provided (gate bird beak bottom region) does not overlap with the depletion layer 8a within the drain 8 on the surface of the substrate 1 (drain depletion layer surface region), the width S is negative. In this case, a part of the drain 8 in which free electrons exist contacts the tunnel layer 2 where the thickness is St. On the other hand, when the gate bird beak 3a overlaps with the drain depletion layer surface region with the tunnel layer 2 interposed therebetween, the width S is positive and the drain 8 in which the free electrons exist always contacts the tunnel oxide layer 2 where the thickness is thicker than St.

Further, as shown in FIG. 7A, the maximum field intensity suddenly decreases as soon as the overlapping width S becomes positive. Accordingly, it is known that the maximum field intensity between the floating gate 3 and the drain 8 can be decreased by controlling the part of the drain 8 holding the free electrons therein to always contact the tunnel layer 2 where the thickness is thicker than the tunnel thickness St.

As understood from the results shown in FIG. 7A, the maximum field intensity is not always decreased only by forming the gate bird beak 3a on the drain side edge of the floating gate 3. It is necessary that the gate bird beak 3a be formed so that the gate bird beak bottom region overlaps with the drain depletion layer surface region. Even in the case where the gate bird beak 3a is not formed, the maximum field intensity can be reduced by setting an appropriate relationship between the floating gate 3 and the depletion layer within the gate 8.

To summarize the above-mentioned analyses, in the non-selected bit, the drain disturbance can be prevented by controlling the maximum field intensity between the floating gate 3 and the drain 8 not to exceed 7 MV/cm. The maximum field intensity is controlled by controlling the positional relationship between the part of the drain 8 holding the free electrons therein (the drain 8 except the depletion layer) and the floating gate 3. On the other hand, in a selected bit under the writing operation, it is necessary that the part of the drain 8 holding the free electrons therein extends toward the channel region so as not to deteriorate a writing speed. More specifically, it is necessary that the gate bird beak bottom region does not overlap with the depletion layer within the drain 8 as shown in FIG. 7C so that the writing properties do not deteriorate due to the gate bird beak 3a. That is, in the selected bit under the writing condition, it is important that the thickness of the tunnel layer 2 around the portion where the hot electrons are produced is the tunnel thickness St.

Figure 8:
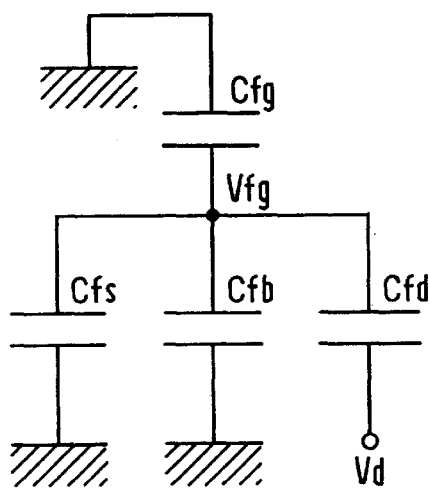
FIG. 8 is a circuit diagram of the two-layer gate type semiconductor memory device.

Next, the positional relationship between the gate bird beak 3a and the drain 8 will be described in a different way based on the above-mentioned analyses. FIG. 8 schematically shows an electrical circuit of the two-layer gate type semiconductor device in the non-selected state. Based on the circuit in FIG. 8, a voltage vfg on the floating gate 3 can be represented with the following formula (1);

$$Vfg = (-Q(t) + Cfd \cdot Vd)/(Cfd + Cfb + Cfs + Cfg) \quad (1)$$

$$= (Cfg \cdot \Delta vt + Cfd \cdot Vd)/(Cfd + Cfb + Cfs + Cfg)$$

wherein Q(t) is an amount of electric charges in response to a writing amount t;

Cfd is an electrostatic capacity between the floating gate 3 and the drain 8;

Cfb is an electrostatic capacity between the floating gate 3 and the substrate 1;

Cfs is an electrostatic capacity between the floating gate 3 and the source 7;

Cfg is an electrostatic capacity between the floating gate 3 and the control gate 5;

Vd is a voltage applied to the drain 8; and

ΔVd is an amount of variations in the voltage on the floating gate 3.

The electrostatic capacities Cfd, Cfb, Cfs, and Cfg are constants determined in accordance with an area of the floating gate 3, the thickness of the tunnel layer 2, and relative dielectric constants of the tunnel layer 2 and the second gate insulating layer 4. Further, the voltage Vd is controlled at an approximately constant value. Therefore, the amount of Vfg substantially changes in response to the amount of electric charges Q(t).

Further, a maximum field intensity Efd(MAX) in the tunnel layer 2 between the floating gate 3 and the drain 8 is represented with the following formula (2);

$$Efd(MAX) = (Vd - Vfg)/Sfd(MIN) \quad (2)$$

wherein Sfd(MIN) is a minimum distance between the floating gate 3 and the drain 8. In a case where the writing amount t into the floating gate 3 is large, the amount of vfg becomes relatively large. In this case, the maximum field intensity Efd(MAX) can be decreased by increasing the minimum distance Sfd(MIN).

Here, when the voltage is applied to the drain 8, an electrical potential of the depletion layer 8a in the drain 8 is different from that of the other part of the drain 8. Because of this, the minimum distance Sfd(MIN) means the minimum distance between the floating gate 3 and the drain 8 except the depletion layer 8a. Therefore, when the tunnel thickness St of the tunnel oxide layer 2 is substituted for the minimum distance Sfd(MIN) in the formula (2), an amount of (Vd–Vfg)/St may be equal to or larger than 7 MV/cm. However, in such a case, when the actual minimum distance Sfd(MIN) between the floating gate 3 and the drain 8 is larger than the tunnel thickness St of the tunnel layer 2, the maximum field intensity Efd(MAX) can be set to be smaller than 7 MV/cm. More specifically, under conditions providing a relationship that (Vd–Vfg)/St is equal to 7 MV/cm, when the gate bird beak bottom region and the drain depletion layer surface region are overlapped on each other through the tunnel layer 2, the actual minimum distance Sfd(MIN) is larger than the tunnel thickness St of the tunnel oxide layer 2. Therefore, the positional relationship between the gate bird beak 3a and the drain 8 is determined under the above-mentioned conditions such that the gate bird beak bottom region overlaps with the drain depletion layer surface region through the tunnel layer 2. As a result, the maximum field intensity Efd(MAX) can be set to be smaller than 7 MV/cm, so that the drain disturbance can be sufficiently prevented.

Figure 9A:
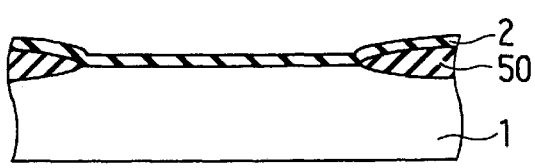
FIGS. 9A to 9F are cross-sectional views for explaining processes of manufacturing the two-layer gate type semiconductor memory device.

Finally, a method for manufacturing the semiconductor memory device shown in FIGS. 4A and 4B will be described with reference to FIGS. 9A to 9F. That is, as shown in FIG. 9A, a LOCOS layer 50 for dividing elements is selectively formed in a specific surface region of the P-type silicon substrata 1 (or in a P-type well). Then, an oxide layer having a thickness of approximately 100 Å to 120 Å is formed on the surface of the P-type silicon substrate 1, and is nitrided, thereby forming the tunnel layer (first gate insulating layer) 2.

Figure 9B:
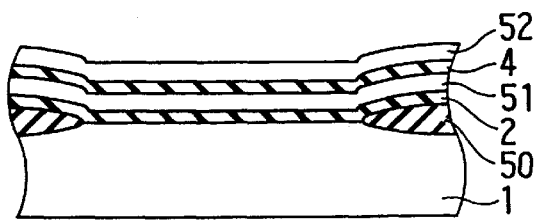
Figure 9C:
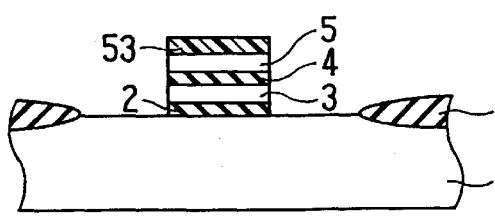

Successively, after performing ion implantation for controlling a threshold value, as shown in FIG. 9B, a polysilicon layer 51 for a first gate electrode layer, the second insulating layer 4 composed of an oxide layer, a nitride layer, and an oxide layer laminated in this order, and a polysilicon layer 52 for a second gate electrode layer are formed in this order. Then, a photo-resist layer 53 is disposed only on the area for the gate, and an anisotropic etching process is performed using a gas including chlorine as an etching gas and the photo-resist layer 53 as an etching mask. Accordingly, as shown in FIG. 9C, the first insulating layer 2, the floating gate 3, the second insulating layer 4, and the control gate 5 that are formed on the substrate 1 can be obtained.

Figure 9D:
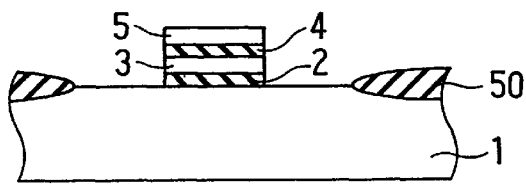
Figure 9E:
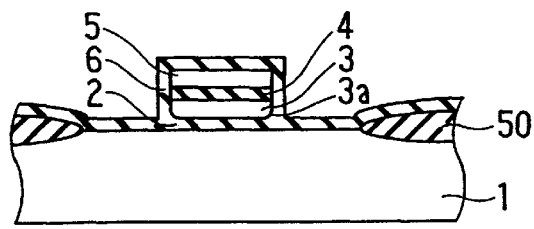

Next, the photo-resist layer 53 is removed by an oxygen ashing process as shown in FIG. 9D. Thereafter, a thermal oxidization process is performed to form the side wall insulating layer 6. At that time, the edges of the floating gate 3 are also oxidized such that it is rounded off, thereby forming the gate bird beak 3a as shown in FIG. 9E. The size of each gate bird beak 3a can be controlled by controlling conditions of the thermal oxidization process such as time, temperature, and the like. Further, the position of the drain 8 that is to be formed in the next step can be controlled by controlling the thickness of the side wall insulating layer 6. The position of the end of the depletion layer when the voltage is applied to the drain 8 is determined in accordance with the position of the drain 8.

Figure 9F:
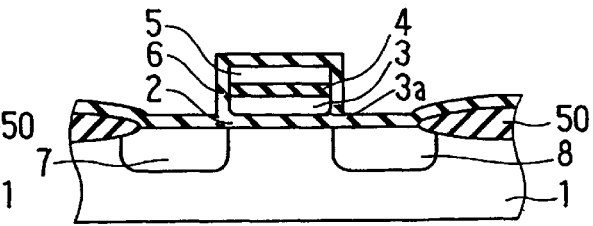

After forming the side wall insulating layer 6, the source 7 and the drain 8 are formed in the silicon substrate 1 as shown in FIG. 9F by an ion implantation process using the floating and control gates 3 and 5 as a mask. The width and the depth of the drain 8 can be controlled by controlling a dose and an implanting angle, an accelerating energy, and the like in the ion implantation process. Accordingly, the position of the end and the width of the depletion layer when the voltage is applied to the drain 8 is also controlled. Furthermore, an aluminum wiring pattern (not shown) is formed on the substrate 1 to be connected to respective electrodes, thereby completing the two-layer gate type semiconductor memory device.

In this way, when manufacturing the semiconductor memory device, the size of the gate bird beak 3a, the thickness of the side wall insulating layer 6, the dose, the implanting angle, the accelerating energy, and the like in the ion implantation process for forming the source 7 and drain 8 are adequately controlled. Accordingly, the positional relationship between the gate bird beak 3a and the drain 8 can be determined such that the drain depletion layer surface region overlaps with the gate bird beak bottom region through the tunnel layer 2, even in the case that the amount of (Vd−Vfg)/St is larger than 7 MV/cm, the maximum field intensity between the floating gate 3 and the drain 8 can be controlled to be equal to or smaller than 7 MV/cm. Consequently, the drain disturbance can be prevented.

In the embodiment, the P-type silicon substrate 1 is employed. However, another silicon substrate in which a P-type well layer is provided, a N-type conductive material, and the like may be employed in place of the P-type silicon substrate 1. Although the gate bird beak 3a is formed in the embodiment, as mentioned above, it is not always necessary. Even if the gate bird beak 3a is not formed, the drain disturbance can be prevented by adequately controlling the positional relationship between the drain side edge of the floating gate 3 and the depletion layer in the drain 8.

Although the present invention is applied to the flash memory having the tunnel layer serving as the first gate insulating layer in the embodiment, it is apparent that the present invention can be applied to EPROMs, EEPROMs, and the like. The flash memory in the embodiment is a stack type including the floating gate 3 and the control gate 5 having the same width with respect to each other. However, the width and the pattern of the floating gate may be different from those of the control gate.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A semiconductor memory device comprising:
   a substrate;
   a first insulating layer provided on the substrate and having a first region with a first thickness and a second region thicker than the first thickness;
   a floating gate provided on the substrate through the first insulating layer;
   a second insulating layer provided on the floating gate;
   a control gate provided on the floating gate through the second insulating layer;
   a drain provided in the substrate to have an overlapped portion facing the floating gate through the first insulating layer;
   a source provided in the substrate; and
   a depletion layer extending inside of the drain within the overlapped portion when the semiconductor memory device is in a nonselected state, said depletion layer preventing the overlapped portion of the drain, other than the depletion layer, from contacting the first region of the first insulating layer.

2. The semiconductor memory device according to claim 1, wherein in the non-selected state of the semiconductor memory device, the depletion layer extends in the drain such that an end of the depletion layer contacts the second region of the first insulating layer.

3. The semiconductor memory device according to claim 1, wherein in a selected state of the semiconductor memory device, the overlapped portion of the drain other than the depletion layer contacts the first and second regions of the first insulating layer.

4. The semiconductor memory device according to claim 1, wherein the first and second regions of the first insulating layer are made of the same material.

5. The semiconductor memory device according to claim 1, wherein the second region of the first insulating layer has a tapered shape having a thickness which gradually increases from the first thickness.

6. The semiconductor memory device according to claim 1, wherein the second region of the first insulating layer is tapered and has a minimum thickness value substantially equal to the first thickness of the first region.

7. The semiconductor memory device according to claim 1, wherein a maximum carrier density of the depletion layer is approximately $1 \times 10^{19}/cm^3$.

8. The semiconductor memory device according to claim 7, wherein the maximum carrier density of the depletion layer is approximately $1 \times 10^{15}/cm^3$.

9. A semiconductor memory device comprising:
a substrate;
a first insulating layer provided on the substrate;
a floating gate provided on the substrate through the first insulating layer;
a second insulating layer provided on the floating gate;
a control gate provided on the floating gate though the second insulating layer;
a drain provided in the substrate to have a portion overlapped with the floating gate through the first insulating layer; and
a source provided in the substrate, wherein the first insulating layer facing the overlapped portion of the drain has a first region and a second region, the second region facing an end portion of the floating gate and having a thickness greater than that of the first region; and
wherein an overlapped amount of the overlapped portion of the drain is determined such that, in a non-selected state of the semiconductor memory device, the drain, other than a depletion layer formed within the drain, contacts, only the second region of the first insulating layer.

10. The semiconductor memory device according to claim 9, wherein in a selected state of the semiconductor memory device, the drain other than the depletion layer formed within the drain contacts the first region of the first insulating layer.

11. The semiconductor memory device according to claim 9, wherein in the non-selected state, the depletion layer extending within the drain contacts the second region of the first insulating layer.

12. A semiconductor memory device comprising:
a substrate;
a first insulating layer provided on the substrate and having a first region with a first thickness and a second region thicker than the first thickness;
a floating gate provided on the substrate through the first insulating layer;
a second insulating layer provided on the floating gate;
a control gate provided on the floating gate through the second insulating layer;
a drain provided in the substrate to have a portion overlapped with the floating gate through the first insulating layer;
a depletion layer formed within the overlapped portion of the drain when the semiconductor is in selected and non-selected states; and
a source provided in the substrate, wherein in the selected state of the semiconductor memory device, the overlapped portion of the drain, other than the depletion layer, contacts the first and second regions of the first insulating layer; and wherein in the non-selected state of the semiconductor memory device, the overlapped portion of the drain, other than the depletion layer, contacts only the second region of the first insulating layer.

13. The semiconductor memory device according to claim 12, wherein the first and second regions of the first insulating layer are made of the same material.

14. The semiconductor memory device according to claim 12, wherein the second region of the first insulating layer is tapered and has a minimum thickness value substantially equal to the first thickness of the first region.

15. The semiconductor memory device according to claim 12, wherein a maximum carrier density of the depletion layer is approximately $1 \times 10^{19}/cm^3$.

16. The semiconductor memory device according to claim 15, wherein the maximum carrier density of the depletion layer is approximately $1 \times 10^{15}/cm^3$.

17. A semiconductor memory device comprising:
a substrate;
a floating gate provided on the substrate through a first insulating layer;
a control gate provided on the floating gate through a second insulating layer;
a drain formed in the substrate to face an end portion of the floating gate through the first insulating layer; and
a source formed in the substrate,
wherein the first insulating layer has a first region having a first thickness and a second region having a thickness greater than the first thickness, the first region facing the end portion of the floating gate; and
wherein in a non-selected state of the semiconductor memory device, a depletion layer formed within the drain prevents the drain, other than the depletion layer, from contacting the first region of the first insulating layer.

18. The semiconductor memory device according to claim 17, wherein the boundary portion between the first and second regions of the first insulating layer faces the drain other than the depletion layer in a selected state of the semiconductor memory device.

19. The semiconductor memory device according to claim 17, wherein in the non-selected state of the semiconductor memory device, an end of the depletion layer contacts the second region of the first insulating layer.

20. The semiconductor memory device according to claim 17, wherein the first and second regions of the first insulating layer are made of the same material.

21. The semiconductor memory device according to claim 17, wherein the second region of the first insulating layer is tapered and has a minimum thickness value substantially equal to the first thickness of the first region.

22. The semiconductor memory device according to claim 17, wherein a maximum carrier density of the depletion layer is approximately $1 \times 10^{19}/cm^3$.

23. The semiconductor memory device according to claim 22, wherein the maximum carrier density of the depletion layer is approximately $1 \times 10^5/cm^3$.

24. A semiconductor memory device comprising:
a substrate;
a floating gate provided on the substrate;
a first insulating layer disposed between the substrate and the floating gate and including a tunnel region having a tunnel thickness which electrons pass through in a selected state of the semiconductor memory device;

a control gate provided on the floating gate;

a second insulating layer disposed between the floating gate and the control gate;

a drain provided in the substrate and partially facing the floating gate through the first insulating layer; and a depletion layer formed within the drain and separating the drain from the tunnel region of the first insulating layer when the semiconductor memory device is in a non-selected state.

25. The semiconductor memory device according to claim 24, wherein the tunnel thickness is constant at the tunnel region.

26. The semiconductor memory device according to claim 24, wherein:

the first insulating layer has a region of increased thickness; and the drain other than the depletion layer only contacts the region of increased thickness in the non-selected state.

27. The semiconductor memory device according to claim 26, wherein the region of increased thickness is tapered with a thickness which increases from that of the tunnel thickness.

28. The semiconductor memory device according to claim 26, wherein the region of increased thickness and the tunnel region are made of the same material.

29. A semiconductor memory device comprising:

a substrate;

a floating gate provided on the substrate;

a first insulating layer disposed between the substrate and the floating gate and including a first region with a first thickness and a second region thicker than the first thickness;

a control gate provided on the floating gate;

a second insulating layer disposed between the floating gate and the control gate;

a drain provided in the substrate and partially facing the floating gate through the first insulating layer; and a low carrier density layer formed within the drain and separating the drain from the first region of the first insulating layer when the semiconductor memory device is in a non-selected state, the low carrier density layer having a carrier density equal to or less than $1 \times 10^{19}/cm^3$.

30. The semiconductor memory device according to claim 29, wherein the carrier density of the low carrier density layer is equal to or less than $1 \times 10^{15}/cm^3$.

31. A design for a semiconductor memory device including a substrate; a first insulating layer provided on the substrate and having a first region with a first thickness and a second region thicker than the first thickness; a floating gate provided on the substrate through the first insulating layer; a second insulating layer provided on the floating gate; a control gate provided on the floating gate through the second insulating layer; a drain provided in the substrate and partially facing the floating gate through the first insulating layer; and a source provided in the substrate, wherein the semiconductor memory device includes a depletion layer formed in the drain which prevents the drain other than the depletion layer from contacting the first region of the first insulating layer, in a non-selected state of the semiconductor memory device.

32. The design according to claim 31, wherein the drain, except for the depletion layer formed therein, contacts the first and second regions of the first insulating layer in a selected state of the semiconductor memory device.

33. A design for a semiconductor memory device including a substrate; a first insulating layer provided on the substrate and having a first region with a first thickness and a second region thicker than the first thickness; a floating gate provided on the substrate through the first insulating layer; a second insulating layer provided on the floating gate; a control gate provided on the floating gate through the second insulating layer; a drain provided in the substrate and having a portion overlapping the floating gate through the first insulating layer; and a source provided in the substrate, wherein the overlapping portion overlaps the floating gate by an amount whereby the drain, other than for a depletion layer formed in the drain, is prevented from contacting the first region of the first insulating layer in a non-selected state of the semiconductor memory device.

34. A design according to claim 33, wherein the overlapping portion overlaps the floating gate by an amount whereby other than for the depletion layer formed in the drain, the drain contacts the first region of the first insulating layer in a selected state of the semiconductor memory device.

35. A design for a semiconductor memory device including a substrate; a first insulating layer provided on the substrate and having a first region with a first thickness and a second region thicker than the first thickness; a floating gate provided on the substrate through the first insulating layer; a control gate provided on the floating gate through a second insulating layer; a drain provided in the substrate and having a portion overlapping the floating gate through the first insulating layer; and a source provided in the substrate, wherein in a non-selected state of the semiconductor memory device, a depletion layer extends within the drain to have an end portion overlapping a boundary between the first and second regions of the first insulating layer and contacting the second region of the first insulating layer to prevent the drain from contacting the first region of the first insulating layer.

36. A design according to claim 35, wherein the boundary portion is located such that in a selected state of the semiconductor device, the depletion layer within the drain does not overlap the boundary portion in contacting relationship with the first insulating layer thereby allowing the drain to contact the first region of the first insulating layer.

37. A semiconductor memory device operable between selected and non-selected states, said device comprising:

a substrate;

a first insulating layer provided on the substrate and having a first region with a first thickness and a second region thicker than the first region;

a floating gate provided on an opposite side of the first insulating layer from the substrate;

a second insulating layer provided on an opposite side of the floating gate from the first insulating layer;

a control gate provided on an opposite side of the second insulating layer from the floating gate;

a source formed in the substrate;

a drain formed in the substrate in spaced relationship from said source, said drain having a portion disposed in facing relationship with said first insulating layer and overlapping said second region and a segment of the first region, said drain being configured so as to create a depletion layer within the drain in response to application of a voltage to said drain, said depletion layer so created having an end portion which, during the non-selected state of the device, overlaps said segment of the first region and a portion of the second region in contacting relationship therewith, and wherein said depletion layer, during the selected state of the device, is in non-contacting relationship with the first insulating layer overlapping a portion of said segment and being spaced from said second region.

* * * * *